United States Patent
Rahardjo et al.

(10) Patent No.: US 10,409,940 B1
(45) Date of Patent: Sep. 10, 2019

(54) SYSTEM AND METHOD TO PROXY NETWORKING STATISTICS FOR FPGA CARDS

(71) Applicant: Dell Products, L.P., Round Rock, TX (US)

(72) Inventors: Johan Rahardjo, Austin, TX (US); Pavan Kumar Gavvala, Anantapur (IN)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/171,849

(22) Filed: Oct. 26, 2018

(51) Int. Cl.
*G06F 17/50* (2006.01)
*H03K 19/177* (2006.01)
*G06F 3/06* (2006.01)

(52) U.S. Cl.
CPC .......... *G06F 17/5054* (2013.01); *G06F 3/067* (2013.01); *H03K 19/17708* (2013.01)

(58) Field of Classification Search
CPC .. G06F 17/50; G06F 17/5045; G06F 17/5054; G06F 9/06; G06F 9/22; G06F 9/24
See application file for complete search history.

(56) References Cited

U.S. PATENT DOCUMENTS

| | | | | |
|---|---|---|---|---|
| 6,631,520 B1* | 10/2003 | Theron | ..................... | G06F 8/65 712/E9.007 |
| 7,356,620 B2* | 4/2008 | Xia | ..................... | G06F 17/5054 710/104 |
| 7,671,624 B1* | 3/2010 | Walstrum, Jr. | ....... | H03K 19/177 326/37 |
| 9,716,503 B2* | 7/2017 | Wang | ............... | H03K 19/17776 |
| 2003/0217306 A1* | 11/2003 | Harthcock | .......... | G06F 17/5054 714/30 |
| 2016/0314232 A1* | 10/2016 | Larzul | ................. | G06F 17/5054 |
| 2016/0323143 A1* | 11/2016 | Kim | ........................ | G06F 9/441 |
| 2018/0024194 A1* | 1/2018 | Luo | ................ | G01R 31/318519 702/119 |

* cited by examiner

*Primary Examiner* — Jason Crawford
(74) *Attorney, Agent, or Firm* — Fogarty LLP

(57) ABSTRACT

Embodiments are described for supporting remote monitoring and management of FPGA (Field Programmable Gate Array) card operations. The FPGA card includes an external interface supporting core operations of the FPGA and for accessing functions defined by the programmable logic of the FPGA. Network activity data is collected from a network controller of the FPGA card. In response to invocation of an internal operations interface function by an external interface request, the collected network activity data is included in a network report for transmission to a remote access controller. A proxy message compliant with the external interface is used to transport the collected network activity data that is not supported by the external interface. The proxy message is transmitted to an FPGA management controller via the external interface, where it is converted to remote management protocol and transmitted to the remote management controller.

20 Claims, 3 Drawing Sheets

SYSTEM AND METHOD TO PROXY NETWORKING STATISTICS FOR FPGA CARDS

FIELD

The present disclosure generally relates to Information Handling Systems (IHSs), and, more particularly, to remote monitoring and management of components of IHSs.

BACKGROUND

As the value and use of information continues to increase, individuals and businesses seek additional ways to process and store information. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Historically, the most common technique for customizing the operations of an IHS has been through software programs that are executed by the IHS. More recently, FPGA (Field Programmable Gate Array) cards are used to provide customized IHS functionality at hardware speeds, while doing so at an affordable price. FPGA card development is supported through abstraction interfaces that are supported by the manufacturers and developers of FPGA cards. Such interfaces provide support for monitoring and controlling certain aspects of an FPGA card's operation. However, such interfaces may provide little or no support for monitoring certain aspects of an FPGA card's operation.

SUMMARY

In various embodiments, method is provided for remote monitoring and management of operations of an FPGA (Field Programmable Gate Array) card accessed via an external interface. The method includes: receiving a request for network activity data via a function of an external interface that invokes a monitoring function defined in programmable logic of the FPGA card; collecting, by the monitoring function, network activity data from a network controller of the FPGA card; transmitting, by the monitoring function, a proxy message including the network activity data to a management controller of the FPGA card via the external interface; converting the proxy message to a network management message; and transmitting the network management message to a remote access controller.

In additional method embodiments, the external interface of the FPGA card does not include functions for accessing the network controller. In additional method embodiments, the external interface does not include functions for reporting the network activity data. In additional method embodiments, the monitoring function is defined by an operations interface comprises an interface for offloading processing to functions defined in the programmable logic of the FPGA card. In additional method embodiments, the request for network activity data issued via the external interface by the FPGA card management controller. In additional method embodiments, the network management message transmitted by the FPGA card management controller to the remote management controller comprises a plurality of MCTP (Management Component Transport Protocol) messages. In additional method embodiments, the FPGA management controller transmits the MCTP messages to the remote access controller via a sideband management bus.

In various additional embodiments, a system is provided for remote monitoring and management of network operations of an FPGA (Field Programmable Gate Array) card accessed via an external interface of the FPGA card. The system includes: an FPGA comprising the external interface configured to: receive a request for network activity data; invoke a monitoring function defined in programmable logic of the FPGA card; collect, by the monitoring function, the network activity data from a network controller of the FPGA card; and transmit, by the monitoring function, a proxy message including the network activity data to a management controller of the FPGA card via the external interface; and a management controller of the FPGA card, wherein the management controller is configured to: receive the proxy message via the external interface; convert the proxy message to the network management message; and transmit the network management message to a remote access controller.

In additional system embodiments, the external interface of the FPGA card does not include functions for accessing the network controller. In additional system embodiments, the external interface does not include functions for reporting the network activity data. In additional system embodiments, the network management message transmitted by the FPGA card management controller to the remote management controller comprises a plurality of MCTP (Management Component Transport Protocol) messages. In additional system embodiments, the monitoring function is defined by an operations interface comprises an interface for offloading processing to functions defined in the programmable logic of the FPGA card. In additional system embodiments, the request for network activity data issued via the external interface by the FPGA card management controller.

In various additional embodiments, an FPGA (Field Programmable Gate Array) card accessed via an external interface. The FPGA card includes: a network controller for providing the FPGA card with network communications; the external interface configured to: receive a request for network activity data; invoke a monitoring function defined in programmable logic of the FPGA card; collect, by the monitoring function, the network activity data from a network controller of the FPGA card; and transmit, by the monitoring function, a proxy message including the network activity data to a management controller of the FPGA card via the external interface; and the management controller configured to: receive the proxy message by via the external interface; convert the proxy message to the network management message; and transmit the network management message to a remote management controller.

In additional FPGA card embodiments, the external interface of the FPGA card does not include functions for accessing the network controller. In additional FPGA card embodiments, the external interface does not include functions for reporting the network activity data. In additional FPGA card embodiments, the network management message transmitted by the FPGA card management controller to the remote management controller comprises a plurality of MCTP (Management Component Transport Protocol) messages. In additional FPGA card embodiments, the monitoring function is defined by an operations interface comprises an interface for offloading processing to functions defined in the programmable logic of the FPGA card. In additional FPGA card embodiments, the request for network activity data issued via the external interface by the FPGA card management controller. In additional FPGA card embodiments, the FPGA management controller transmits the MCTP messages to the remote access controller via a sideband management bus.

BRIEF DESCRIPTION OF THE DRAWINGS

The present invention(s) is/are illustrated by way of example and is/are not limited by the accompanying figures. Elements in the figures are illustrated for simplicity and clarity, and have not necessarily been drawn to scale.

DETAILED DESCRIPTION

Figure 1:
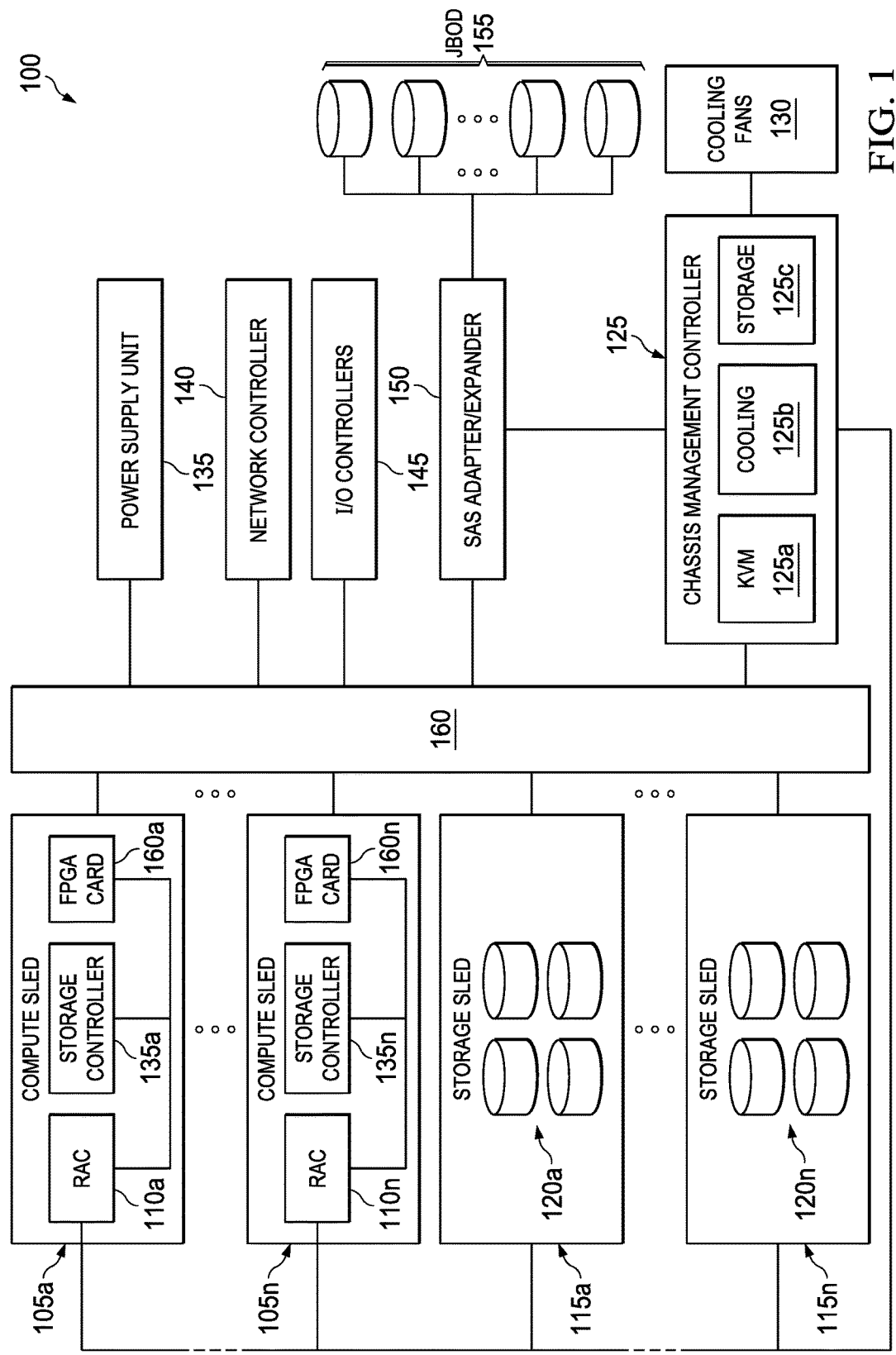
FIG. 1 is a diagram illustrating certain components of a chassis, according to some embodiments, for supporting remote monitoring and management of FPGA card network operations.

FIG. 1 is a block diagram illustrating certain components of a chassis 100 comprising one or more compute sleds 105a-n and one or more storage sleds 115a-n that may be configured to implement the systems and methods described herein. Chassis 100 may include one or more bays that each receive an individual sled (that may be additionally or alternatively referred to as a tray, blade, and/or node), such as compute sleds 105a-n and storage sleds 115a-n. Chassis 100 may support a variety of different numbers (e.g., 4, 8, 16, 32), sizes (e.g., single-width, double-width) and physical configurations of bays. Other embodiments may include additional types of sleds that provide various types of storage and/or processing capabilities. Other types of sleds may provide power management and networking functions. Sleds may be individually installed and removed from the chassis 100, thus allowing the computing and storage capabilities of a chassis to be reconfigured by swapping the sleds with different types of sleds, in many cases without affecting the operations of the other sleds installed in the chassis 100.

Multiple chassis 100 may be housed within a rack. Data centers may utilize large numbers of racks, with various different types of chassis installed in the various configurations of racks. The modular architecture provided by the sleds, chassis and rack allow for certain resources, such as cooling, power and network bandwidth, to be shared by the compute sleds 105a-n and storage sleds 115a-n, thus providing efficiency improvements and supporting greater computational loads.

Chassis 100 may be installed within a rack structure that provides all or part of the cooling utilized by chassis 100. For airflow cooling, a rack may include one or more banks of cooling fans that may be operated to ventilate heated air from within the chassis 100 that is housed within the rack. The chassis 100 may alternatively or additionally include one or more cooling fans 130 that may be similarly operated to ventilate heated air from within the sleds 105a-n, 115a-n installed within the chassis. A rack and a chassis 100 installed within the rack may utilize various configurations and combinations of cooling fans to cool the sleds 105a-n, 115a-n and other components housed within chassis 100.

The sleds 105a-n, 115a-n may be individually coupled to chassis 100 via connectors that correspond to the bays provided by the chassis 100 and that physically and electrically couple an individual sled to a backplane 160. Chassis backplane 160 may be a printed circuit board that includes electrical traces and connectors that are configured to route signals between the various components of chassis 100 that are connected to the backplane 160. In various embodiments, backplane 160 may include various additional components, such as cables, wires, midplanes, backplanes, connectors, expansion slots, and multiplexers. In certain embodiments, backplane 160 may be a motherboard that includes various electronic components installed thereon. Such components installed on a motherboard backplane 160 may include components that implement all or part of the functions described with regard to the SAS (Serial Attached SCSI) expander 150, I/O controllers 145, network controller 140 and power supply unit 135.

Figure 2:
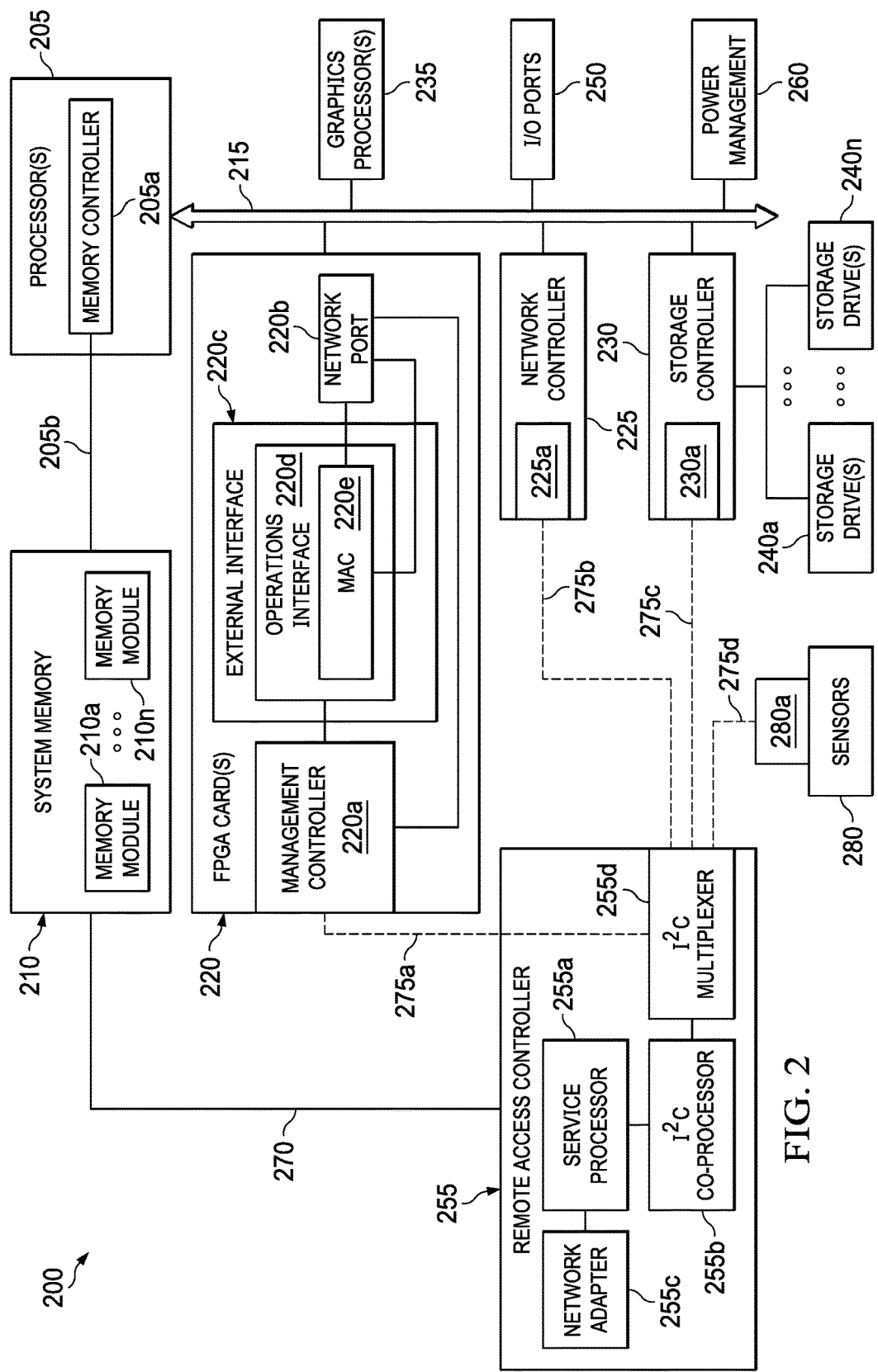
FIG. 2 is a diagram illustrating certain components of an IHS configured as a component of chassis, according to some embodiments, for supporting remote monitoring and management of FPGA card network operations.

In certain embodiments, a compute sled 105a-n may be an IHS such as described with regard to IHS 200 of FIG. 2. A compute sled 105a-n may provide computational processing resources that may be used to support a variety of e-commerce, multimedia, business and scientific computing applications, such as services provided via a cloud implementation. Compute sleds 105a-n are typically configured with hardware and software that provide leading-edge computational capabilities. Accordingly, services provided using such computing capabilities are typically provided as high-availability systems that operate with minimum downtime. As described in additional detail with regard to FIG. 2, compute sleds 105a-n may be configured for general-purpose computing or may be optimized for specific computing tasks.

As illustrated, each compute sled 105a-n includes a remote access controller (RAC) 110a-n. As described in additional detail with regard to FIG. 2, remote access controller 110a-n provides capabilities for remote monitoring and management of compute sled 105a-n. In support of these monitoring and management functions, remote access controllers 110a-n may utilize both in-band and sideband (i.e., out-of-band) communications with various components of a compute sled 105a-n and chassis 100. Remote access controller 110a-n may collect sensor data, such as temperature sensor readings, from components of the chassis 100 in support of airflow cooling of the chassis 100 and the sleds 105a-n, 115a-n. In addition, each remote access controller 110a-n may implement various monitoring and administrative functions related to compute sleds 105a-n that require sideband bus connections with various internal components of the respective compute sleds 105a-n.

As illustrated, chassis 100 also includes one or more storage sleds 115a-n that are coupled to the backplane 160 and installed within one or more bays of chassis 200 in a similar manner to compute sleds 105a-n. Each of the individual storage sleds 115a-n may include various different numbers and types of storage devices. For instance, storage sleds 115a-n may include SAS (Serial Attached SCSI) magnetic disk drives, SATA (Serial Advanced Technology Attachment) magnetic disk drives, solid-state drives (SSDs) and other types of storage drives in various combinations. The storage sleds 115a-n may be utilized in various storage configurations by the compute sleds 105a-n that are coupled to chassis 100.

Each of the compute sleds 105a-n includes a storage controller 135a-n that may be utilized to access storage drives that are accessible via chassis 100. Some of the individual storage controllers 135a-n may provide support for RAID (Redundant Array of Independent Disks) configurations of logical and physical storage drives, such as storage drives provided by storage sleds 115a-n. In some embodiments, some or all of the individual storage controllers 135a-n may be HBAs (Host Bus Adapters) that provide more limited capabilities in accessing physical storage drives provided via storage sleds 115a-n and/or via SAS expander 150.

As illustrated, each of the compute sleds 105a-n also includes an FPGA card 160a-n that may be configured to customize the operations of compute sled 105a-n. As described in additional detail with regard to FIGS. 2 and 3, FPGA cards 160a-n operations may be monitored by remote access controllers 110a-n via sideband management bus connections. FPGA cards 160a-n may include interfaces for programming the functionality of the FPGA card and for monitoring certain operations by the FPGA cards. However, certain operations of the FPGA card, such as monitoring of certain network activity and interfacing directly with the network controller of the FPGA card, may be unsupported by these interfaces, thus limiting certain monitoring functions of the remote access controllers 110a-n.

In addition to the data storage capabilities provided by storage sleds 115a-n, chassis 100 may provide access to other storage resources that may be installed components of chassis 100 and/or may be installed elsewhere within a rack housing the chassis 100, such as within a storage blade. In certain scenarios, such storage resources 155 may be accessed via a SAS expander 150 that is coupled to the backplane 160 of the chassis 100. The SAS expander 150 may support connections to a number of JBOD (Just a Bunch Of Disks) storage drives 155 that may be configured and managed individually and without implementing data redundancy across the various drives 155. The additional storage resources 155 may also be at various other locations within a datacenter in which chassis 100 is installed. Such additional storage resources 155 may also may be remotely located.

As illustrated, the chassis 100 of FIG. 1 includes a network controller 140 that provides network access to the sleds 105a-n, 115a-n installed within the chassis. Network controller 140 may include various switches, adapters, controllers and couplings used to connect chassis 100 to a network, either directly or via additional networking components and connections provided via a rack in which chassis 100 is installed. Chassis 100 may similarly include a power supply unit 135 that provides the components of the chassis with various levels of DC power from an AC power source or from power delivered via a power system provided by a rack within which chassis 100 may be installed. In certain embodiments, power supply unit 135 may be implemented within a sled that may provide chassis 100 with redundant, hot-swappable power supply units.

Chassis 100 may also include various I/O controllers 140 that may support various I/O ports, such as USB ports that may be used to support keyboard and mouse inputs and/or video display capabilities. Such I/O controllers 145 may be utilized by the chassis management controller 125 to support various KVM (Keyboard, Video and Mouse) 125a capabilities that provide administrators with the ability to interface with the chassis 100. The chassis management controller 125 may also include a storage module 125c that provides capabilities for managing and configuring certain aspects of the storage devices of chassis 100, such as the storage devices provided within storage sleds 115a-n and within the JBOD 155.

In addition to providing support for KVM 125a capabilities for administering chassis 100, chassis management controller 125 may support various additional functions for sharing the infrastructure resources of chassis 100. In some scenarios, chassis management controller 125 may implement tools for managing the power 135, network bandwidth 140 and airflow cooling 130 that are available via the chassis 100. As described, the airflow cooling 130 utilized by chassis 100 may include an airflow cooling system that is provided by a rack in which the chassis 100 may be installed and managed by a cooling module 125b of the chassis management controller 125.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. As described, an IHS may also include one or more buses operable to transmit communications between the various hardware components. An example of an IHS is described in more detail below.

FIG. 2 shows an example of an IHS 200 configured to implement systems and methods described herein. It should be appreciated that although the embodiments described herein may describe an IHS that is a compute sled or similar computing component that may be deployed within the bays of a chassis, other embodiments may be utilized with other types of IHSs. In the illustrative embodiment of FIG. 2, IHS 200 may be a computing component, such as compute sled 105a-n, that is configured to share infrastructure resources provided by a chassis 100.

The IHS 200 of FIG. 2 may be a compute sled, such as compute sleds 105a-n of FIG. 1, that may be installed within a chassis, that may in turn be installed within a rack. Installed in this manner, IHS 200 may utilized shared power, network and cooling resources provided by the chassis and/or rack. IHS 200 may utilize one or more processors 205. In some embodiments, processors 205 may include a main processor and a co-processor, each of which may include a plurality of processing cores that, in certain scenarios, may each be used to run an instance of a server process. In certain embodiments, one or all of processor(s) 205 may be graphics processing units (GPUs) in scenarios where IHS 200 has been configured to support functions such as multimedia services and graphics applications.

As illustrated, processor(s) 205 includes an integrated memory controller 205a that may be implemented directly within the circuitry of the processor 205, or the memory controller 205a may be a separate integrated circuit that is located on the same die as the processor 205. The memory controller 205a may be configured to manage the transfer of data to and from the system memory 210 of the IHS 205 via a high-speed memory interface 205b.

The system memory 210 is coupled to processor(s) 205 via a memory bus 205b that provides the processor(s) 205 with high-speed memory used in the execution of computer program instructions by the processor(s) 205. Accordingly, system memory 210 may include memory components, such as such as static RAM (SRAM), dynamic RAM (DRAM), NAND Flash memory, suitable for supporting high-speed memory operations by the processor(s) 205. In certain embodiments, system memory 210 may combine both persistent, non-volatile memory and volatile memory.

In certain embodiments, the system memory 210 may be comprised of multiple removable memory modules. The system memory 210 of the illustrated embodiment includes removable memory modules 210a-n. Each of the removable memory modules 210a-n may correspond to a printed circuit board memory socket that receives a removable memory module 210a-n, such as a DIMM (Dual In-line Memory Module), that can be coupled to the socket and then decoupled from the socket as needed, such as to upgrade memory capabilities or to replace faulty components. Other embodiments of IHS system memory 210 may be configured with memory socket interfaces that correspond to different types of removable memory module form factors, such as a Dual In-line Package (DIP) memory, a Single In-line Pin Package (SIPP) memory, a Single In-line Memory Module (SIMM), and/or a Ball Grid Array (BGA) memory.

IHS 200 may utilize a chipset that may be implemented by integrated circuits that are connected to each processor 205. All or portions of the chipset may be implemented directly within the integrated circuitry of an individual processor 205. The chipset may provide the processor(s) 205 with access to a variety of resources accessible via one or more buses 215. Various embodiments may utilize any number of buses to provide the illustrated pathways served by bus 215. In certain embodiments, bus 215 may include a PCIe (PCI Express) switch fabric that is accessed via a PCIe root complex. IHS 200 may also include one or more I/O ports 250, such as PCIe ports, that may be used to couple the IHS 200 directly to other IHSs, storage resources or other peripheral components.

As illustrated, a variety of resources may be coupled to the processor(s) 205 of the IHS 200 via bus 215. For instance, processor(s) 205 may be coupled to a network controller 225, such as provided by a Network Interface Controller (NIC) that is coupled to the IHS 200 and allows the IHS 200 to communicate via an external network, such as the Internet or a LAN. Processor(s) 205 may also be coupled to a power management unit 260 that may interface with the power system unit 135 of the chassis 100 in which an IHS, such as a compute sled, may be installed. In certain embodiments, a graphics processor 235 may be comprised within one or more video or graphics cards, or an embedded controller, installed as components of the IHS 200. In certain embodiments, graphics processor 235 may be an integrated of the remote access controller 255 and may be utilized to support the display of diagnostic and administrative interfaces related to IHS 200 via display devices that are coupled, either directly or remotely, to remote access controller 255.

As illustrated, IHS 200 may include one or more FPGA (Field-Programmable Gate Array) card(s) 220. Each of the FPGA card 220 supported by IHS 200 may include various processing and memory resources, in addition to an FPGA integrated circuit that may be reconfigured after deployment of IHS 200 through programming functions supported by the FPGA card 220. Each individual FGPA card 220 may be optimized to perform specific processing tasks, such as specific signal processing, security, data mining, and artificial intelligence functions, and/or to support specific hardware coupled to IHS 200.

As illustrated, an FPGA card 220 may include an external interface 220c that provides an interface to the programmable circuitry of the FPGA and supports certain core operations of the FPGA. For instance, the external interface 220c may support input and output operations (such as support for a bus protocol) and memory operations. In certain scenarios, the external interface 220c may include certain limited support for monitoring certain aspects of the FPGA, such as monitoring temperatures, power consumption and performance metrics of the FPGA.

In certain scenarios, the external interface 220c for the programmable FPGA circuitry may be defined by the manufacturer and/or seller of the FPGA card. These manufacturers and/or sellers that support the external interface 220c may strictly limit the functions that are supported by the interface. As such, the external interface 220c of an FPGA card 220 may support a limited set of operations that are not extensible by users of the external interface 220c. For instance, the external interface 220c of an FPGA card 220 may support only a limited set of monitoring operations. The remote access controller 255, however, may be capable of supporting a much greater range of monitoring and management functions than are supported by the external interface 220c. For instance, the external interface 220c does not support communications directly with the network controller 220e of the FPGA card and thus does not support access to various network monitoring functions that may be provided by the network controller 220e.

As described, the FPGA may be reprogrammed, thus modifying the configuration of the internal circuity of the FPGA for execution of specialized functions at hardware operating speeds. Access to such programmed functions of the FPGA may be supported by the external interface 220c of the FPGA. For instance, an external interface 220c may include an operations interface 220d. The operations interface 220d may be supported as a feature of the external interface 220c and is thus not otherwise externally accessible. Since the operations interface 220d is only supported via functions of the external interface 220c, the operations interface 220d is similarly limited with regards to the functions that are supported by the FPGA card manufacturer or seller. However, in certain embodiments, the operations interface 220d may be configured to provide access to the customized functionality performed according to the programmed FPGA card. For instance, the operations interface 220d may support the ability to invoke functions that are being offloaded from the processor 205 of the IHS 200 for execution using the programmed FPGA circuitry 220c.

In certain embodiments, a monitoring function may be defined as a function supported by the operations interface 220d. The monitoring function defined in the operations interface 220d may be configured to access the media access controller (MAC) 220e of the FPGA card 220, and thus may also be configured to collect network activity information in support of monitoring operations by the remote access controller 255. By accessing the MAC 220e directly, the monitoring function of the operations interface 220d provides access to a range of network activity information related to the specific network transactions being conducted by the MAC 220e. The MAC 220e may manage connections to external networks that are accessed via a network port 220b by which various types of connectors may be coupled to the FPGA card 220. In certain embodiments, the network port 220b may be a QSFP (Quad Small Form-factor Pluggable) port that may support high-speed couplings used to bridge the FPGA card 220 directly to other components.

The FPGA card 220 may also include a management controller 220a that may support interoperation with the remote access controller 255 via a sideband device management bus 275a. As described in additional detail with regard to the below embodiments, the management controller 220a may be configured to receive network activity data via the external interface 220c of the FPGA card 220, where the network activity data is communicated via proxy messages generated by the monitoring function defined in the operations interface 220d. The management controller 220a may be further configured to report the network activity data included in the proxy messages to the remote access controller 255 via a device management interface.

Upon receipt of a proxy message that includes network activity data, the management controller 220a may be configured to convert the network activity data included within the proxy message to a device management message supported for communication with the remote access controller 255 via the sideband management bus 275a. For instance, in certain embodiments, the management controller 220a may convert the proxy messages to MCTP messages that support reporting network activity.

In certain embodiments, IHS 200 may operate using a BIOS (Basic Input/Output System) that may be stored in a non-volatile memory accessible by the processor(s) 205. The BIOS may provide an abstraction layer by which the operating system of the IHS 200 interfaces with the hardware components of the IHS. Upon powering or restarting IHS 200, processor(s) 205 may utilize BIOS instructions to initialize and test hardware components coupled to the IHS, including both components permanently installed as components of the motherboard of IHS 200 and removable components installed within various expansion slots supported by the IHS 200. The BIOS instructions may also load an operating system for use by the IHS 200. In certain embodiments, IHS 200 may utilize Unified Extensible Firmware Interface (UEFI) in addition to or instead of a BIOS. In certain embodiments, the functions provided by a BIOS may be implemented, in full or in part, by the remote access controller 255.

In certain embodiments, remote access controller 255 may operate from a different power plane from the processors 205 and other components of IHS 200, thus allowing the remote access controller 255 to operate, and management tasks to proceed, while the processing cores of IHS 200 are powered off. As described, various functions provided by the BIOS, including launching the operating system of the IHS 200, may be implemented by the remote access controller 255. In some embodiments, the remote access controller 255 may perform various functions to verify the integrity of the IHS 200 and its hardware components prior to initialization of the IHS 200 (i.e., in a bare-metal state).

Remote access controller 255 may include a service processor 255a, or specialized microcontroller, that operates management software that supports remote monitoring and administration of IHS 200. Remote access controller 255 may be installed on the motherboard of IHS 200 or may be coupled to IHS 200 via an expansion slot provided by the motherboard. In support of remote monitoring functions, network adapter 225c may support connections with remote access controller 255 using wired and/or wireless network connections via a variety of network technologies. As a non-limiting example of a remote access controller, the integrated Dell Remote Access Controller (iDRAC) from Dell® is embedded within Dell PowerEdge™ servers and provides functionality that helps information technology (IT) administrators deploy, update, monitor, and maintain servers remotely.

In some embodiments, remote access controller 255 may support monitoring and administration of various managed devices 220, 225, 230, 280 of an IHS via a sideband bus interface. For instance, messages utilized in device management may be transmitted using I2C sideband bus connections 275a-d that may be individually established with each of the respective managed devices 220, 225, 230, 280 through the operation of an I2C multiplexer 255d of the remote access controller. As illustrated, certain of the managed devices of IHS 200, such as FPGA cards 220, network controller 225 and storage controller 230, are coupled to the IHS processor(s) 205 via an in-line bus 215, such as a PCIe root complex, that is separate from the I2C sideband bus connections 275a-d used for device management. The management functions of the remote access controller 255 may utilize information collected by various managed sensors 280 located within the IHS. For instance, temperature data collected by sensors 280 may be utilized by the remote access controller 255 in support of closed-loop airflow cooling of the IHS 200.

In certain embodiments, the service processor 255a of remote access controller 255 may rely on an I2C co-processor 255b to implement sideband I2C communications between the remote access controller 255 and managed components 220, 225, 230, 280 of the IHS. The I2C co-processor 255b may be a specialized co-processor or microcontroller that is configured to interface via a sideband I2C bus interface with the managed hardware components 220, 225, 230, 280 of IHS. In some embodiments, the I2C co-processor 255b may be an integrated component of the service processor 255a, such as a peripheral system-on-chip feature that may be provided by the service processor 255a. Each I2C bus 275a-d is illustrated as single line in FIG. 2. However, each I2C bus 275a-d may be comprised of a clock line and data line that couple the remote access controller 255 to I2C endpoints 220a, 225a, 230a, 280a which may be referred to as modular field replaceable units (FRUs).

As illustrated, the I2C co-processor 255b may interface with the individual managed devices 220, 225, 230, 280 via individual sideband I2C buses 275a-d selected through the operation of an I2C multiplexer 255d. Via switching operations by the I2C multiplexer 255d, a sideband bus connection 275a-d may be established by a direct coupling between the I2C co-processor 255b and an individual managed device 220, 225, 230, 280.

In providing sideband management capabilities, the I2C co-processor 255b may each interoperate with corresponding endpoint I2C controllers 220a, 225a, 230a, 280a that implement the I2C communications of the respective managed devices 220, 225, 230. The endpoint I2C controllers 220a, 225a, 230a, 280a may be implemented as a dedicated microcontroller for communicating sideband I2C messages with the remote access controller 255, or endpoint I2C controllers 220a, 225a, 230a, 280a may be integrated SoC functions of a processor of the respective managed device endpoints 220, 225, 230, 280. In certain embodiments, the endpoint I2C controller 280a of the FPGA card 220 may correspond to the management controller 220a described above.

In various embodiments, an IHS 200 does not include each of the components shown in FIG. 2. In various embodiments, an IHS 200 may include various additional components in addition to those that are shown in FIG. 2. Furthermore, some components that are represented as separate components in FIG. 2 may in certain embodiments instead be integrated with other components. For example, in certain embodiments, all or a portion of the functionality provided by the illustrated components may instead be provided by components integrated into the one or more processor(s) 205 as a systems-on-a-chip.

Figure 3:
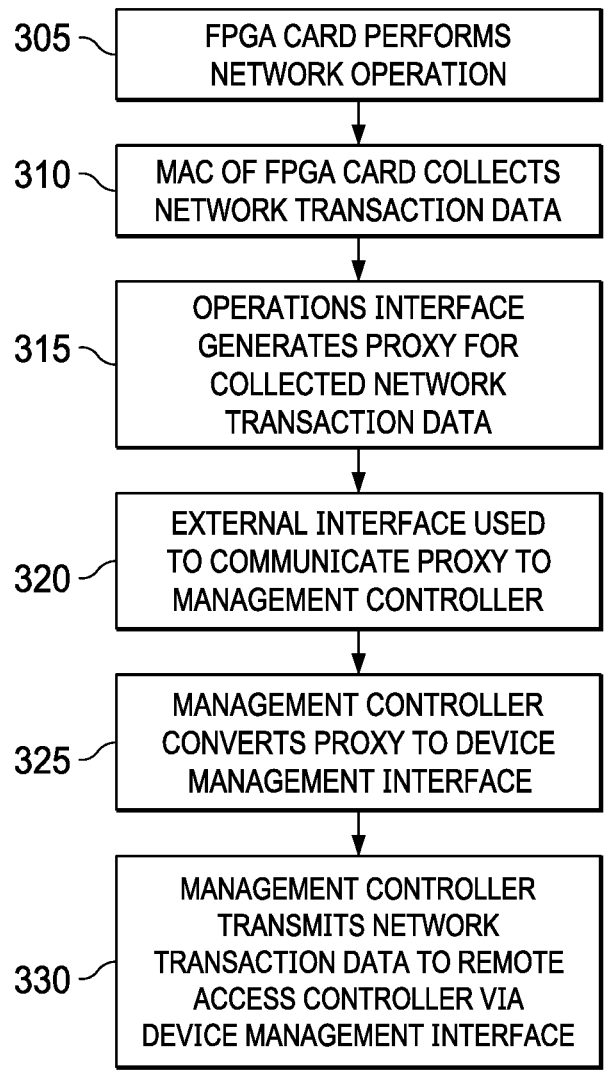
FIG. 3 is a flowchart describing certain steps of a method, according to some embodiments, for supporting remote monitoring and management of FPGA card network operations.

FIG. 3 is a flowchart describing certain steps of a method, according to some embodiments, for supporting remote monitoring and management of FPGA card network operations. As described with regard to FIG. 2, a remote access controller may perform various management and monitoring operations for FPGA cards installed in an IHS, specifically management and monitoring of certain FPGA card network activity. The illustrated method begins at block 305 with an FPGA card, such as FPGA card 220 of FIG. 2, performing a network transaction. At block 310, the media access controller (MAC) of the FPGA card may collect and/or calculate information pertaining to the network transaction. The MAC may provide various mechanisms for accessing the collected network transaction information.

As described, FPGA cards may support an external interface that may support core I/O and memory operations. The functions that are supported by the external interface may be strictly limited. A limited set of monitoring functions may be available via the external interface, but this is likewise limited and non-extensible by users of the external interface. As such the external interface may lack any support specific monitoring functions, such as support for communicating directly with the network controller of the FPGA card, thus limiting the ability to support certain remote network activity monitoring operations, particularly with regard to newer network controllers that may support a range of monitoring functions that are not accessible via the external interface. In particular, the external interface does not support interfacing with network controller monitoring functions that provide bandwidth utilization information, packet retransmission information and/or reports indication a detected reconfiguration of the network controller.

As described, the external interface may support an operations interface that is not otherwise externally accessible. The operation interface may support the ability to invoke functions that are being offloaded to the programmed FPGA. In certain embodiments, a monitoring function may be defined as a function supported by the operations interface, where the monitoring function may access the media access controller of the FPGA card to collect network activity information. In certain embodiments, this monitoring function defined in the operations interface may be periodically invoked by the FPGA management controller via the external interface of the FPGA. At block 315, such a request may be received by the external interface of the FPGA card and may be relayed as an invocation of the monitoring function supported by the operation interface of the FPGA card.

At block 320, the invoked monitoring function of the operations interface receives the request for network activity information. In certain embodiments, the monitoring function may issue requests to the MAC in order to collect the network activity information to be reported. The monitoring function may also periodically collect network activity information such that the collected information is ready for reporting. The monitoring function may then generate a proxy message that includes the collected network activity information. The proxy message conforms with the outputs that are supported by the operations interface, and thus available to the monitoring function. For instance, the proxy message may be encoded as a bit stream parameter supported by the monitoring function defined within the operations interface. In responding to the request by the management controller, the proxy message may be included as such a bitstream parameter in the response to the management controller via the external interface of the FPGA.

Upon receiving the network activity response within the proxy message, at block 325, the management controller of the FPGA card may convert the network activity information contained in the proxy message to a network report supported by the remote access controller, such as MCTP messages. At block 330, the converted message may be transmitted to the remote management controller, where the reported network information may be used in monitoring and management of network operations related to the FPGA card while utilizing the fully-featured network monitoring capabilities of the remote access controller.

In this manner, monitoring functions may be implemented using the programmable capabilities of the FPGA, while utilizing the established functions of the external interface of the FPGA card. As monitoring capabilities provided by components such as network controllers continue to evolve beyond the functions supported by the external interface of the FPGA card, the described embodiments provide for expanding the monitoring data that may be transmitted using proxy messages that are communicated between the FPGA card management controller and the invoked functions of the operations interface using the established functions of the FPGA card external interface and the device monitoring interfaces supported by the remote access controller.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A method for remote monitoring and management of operations of an FPGA (Field Programmable Gate Array) card accessed via an external interface, the method comprising:

receiving a request for network activity data via a function of an external interface that invokes a monitoring function defined in programmable logic of the FPGA card;

collecting, by the monitoring function, network activity data from a network controller of the FPGA card;

transmitting, by the monitoring function, a proxy message including the network activity data to a management controller of the FPGA card via the external interface;

converting the proxy message to a network management message; and transmitting the network management message to a remote access controller.

2. The method of claim 1, wherein the external interface of the FPGA card does not include functions for accessing the network controller.

3. The method of claim 2, wherein the external interface does not include functions for reporting the network activity data.

4. The method of claim 1, wherein the monitoring function is defined by an operations interface comprises an interface for offloading processing to functions defined in the programmable logic of the FPGA card.

5. The method of claim 1, wherein the request for network activity data issued via the external interface by the FPGA card management controller.

6. The method of claim 1, wherein the network management message transmitted by the FPGA card management controller to the remote management controller comprises a plurality of MCTP (Management Component Transport Protocol) messages.

7. The method of claim 6, wherein the FPGA management controller transmits the MCTP messages to the remote access controller via a sideband management bus.

8. A system for remote monitoring and management of network operations of an FPGA (Field Programmable Gate Array) card accessed via an external interface of the FPGA card, the system comprising:

an FPGA comprising the external interface configured to:
receive a request for network activity data;
invoke a monitoring function defined in programmable logic of the FPGA card;
collect, by the monitoring function, the network activity data from a network controller of the FPGA card; and
transmit, by the monitoring function, a proxy message including the network activity data to a management controller of the FPGA card via the external interface; and a management controller of the FPGA card, wherein the management controller is configured to:
receive the proxy message via the external interface;
convert the proxy message to the network management message; and
transmit the network management message to a remote access controller.

9. The system of claim 8, wherein the external interface of the FPGA card does not include functions for accessing the network controller.

10. The system of claim 9, wherein the external interface does not include functions for reporting the network activity data.

11. The system of claim 8, wherein the network management message transmitted by the FPGA card management controller to the remote management controller comprises a plurality of MCTP (Management Component Transport Protocol) messages.

12. The system of claim 8, wherein the monitoring function is defined by an operations interface comprises an interface for offloading processing to functions defined in the programmable logic of the FPGA card.

13. The system of claim 8, wherein the request for network activity data issued via the external interface by the FPGA card management controller.

14. An FPGA (Field Programmable Gate Array) card accessed via an external interface, the FPGA card comprising:

a network controller for providing the FPGA card with network communications;

the external interface configured to:
receive a request for network activity data;
invoke a monitoring function defined in programmable logic of the FPGA card;
collect, by the monitoring function, the network activity data from a network controller of the FPGA card; and
transmit, by the monitoring function, a proxy message including the network activity data to a management controller of the FPGA card via the external interface; and the management controller configured to:
receive the proxy message by via the external interface;
convert the proxy message to the network management message; and
transmit the network management message to a remote management controller.

15. The FPGA card of claim 14, wherein the external interface of the FPGA card does not include functions for accessing the network controller.

16. The FPGA card of claim 15, wherein the external interface does not include functions for reporting the network activity data.

17. The FPGA card of claim 14, wherein the network management message transmitted by the FPGA card management controller to the remote management controller comprises a plurality of MCTP (Management Component Transport Protocol) messages.

18. The FPGA card of claim 14, wherein the monitoring function is defined by an operations interface comprises an interface for offloading processing to functions defined in the programmable logic of the FPGA card.

19. The FPGA card of claim 14, wherein the request for network activity data issued via the external interface by the FPGA card management controller.

20. The FPGA card of claim 14, wherein the FPGA management controller transmits the MCTP messages to the remote access controller via a sideband management bus.

* * * * *